US007691544B2

(12) United States Patent
Gardiner et al.

(10) Patent No.: US 7,691,544 B2
(45) Date of Patent: Apr. 6, 2010

(54) MEASUREMENT OF A SCATTERED LIGHT POINT SPREAD FUNCTION (PSF) FOR MICROELECTRONIC PHOTOLITHOGRAPHY

(75) Inventors: Allen B. Gardiner, Portland, OR (US); Seongtae Jeong, Portland, OR (US); Marie T. Conte, Hillsboro, OR (US); Manish Chandhok, Beaverton, OR (US); Chris Kenyon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 872 days.

(21) Appl. No.: 11/490,924

(22) Filed: Jul. 21, 2006

(65) Prior Publication Data

US 2008/0020292 A1 Jan. 24, 2008

(51) Int. Cl.
*G03F 1/00* (2006.01)
(52) U.S. Cl. .............................. 430/5; 430/30
(58) Field of Classification Search .................. 430/5, 430/22, 30; 382/144, 145; 355/18, 53, 75
See application file for complete search history.

(56) References Cited

U.S. PATENT DOCUMENTS

| 2003/0186132 A1* | 10/2003 | Rumsey et al. ............... 430/5 |
| 2005/0233226 A1* | 10/2005 | Osawa et al. ................. 430/5 |
| 2006/0126053 A1* | 6/2006 | Hinsberg et al. ............ 355/75 |
| 2007/0141476 A1* | 6/2007 | Flanagin et al. .............. 430/5 |

* cited by examiner

*Primary Examiner*—Mark F Huff
*Assistant Examiner*—Stewart A Fraser
(74) *Attorney, Agent, or Firm*—Blakely, Sokoloff, Taylor & Zafman LLP

(57) ABSTRACT

A scattered light point spread function is measured for use in fabricating microelectronic and micromechanical devices using photolithography. In one example, a photosensitive layer of a microelectronic substrate is exposed through a test mask, the test mask having a series of differently sized patterns, each pattern surrounding a central monitor feature, the differently sized patterns each being evenly distributed about its respective central monitor feature. An indication of the exposure of the photosensitive layer is measured for a plurality of the series of differently sized patterns. The exposure indication is compared to the pattern size. The comparison is fitted to a function and the function is applied in correcting photolithography mask layouts.

19 Claims, 7 Drawing Sheets

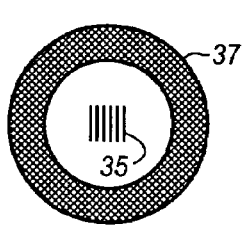
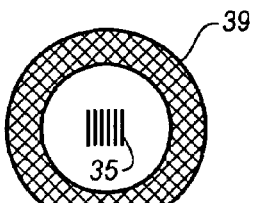
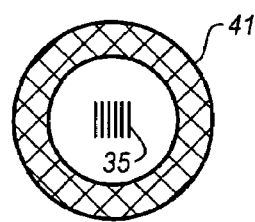
FIG. 3A     FIG. 3B     FIG. 3C
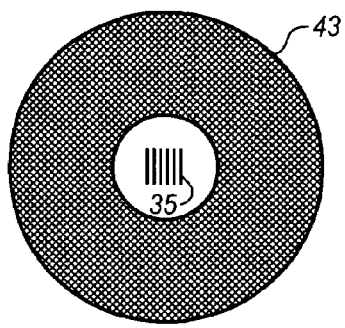
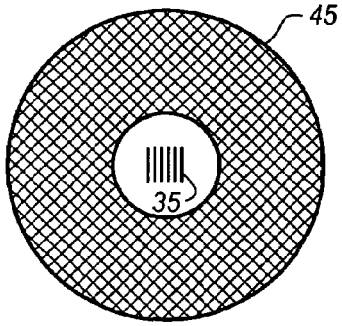
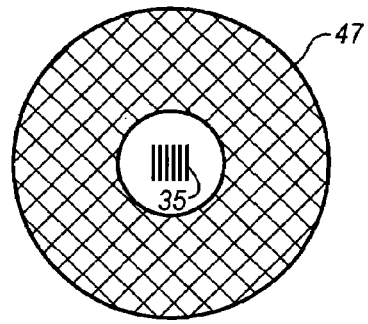
FIG. 3D     FIG. 3E     FIG. 3F
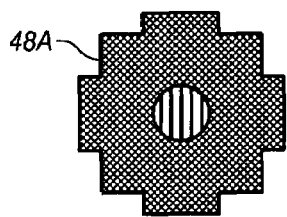
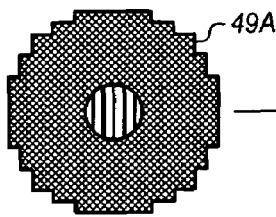
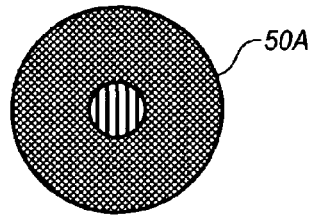
FIG. 4A     FIG. 4B     FIG. 4C
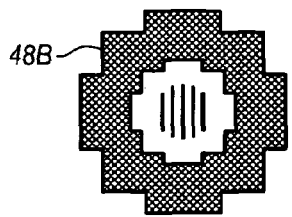
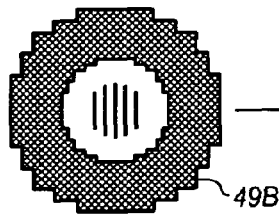
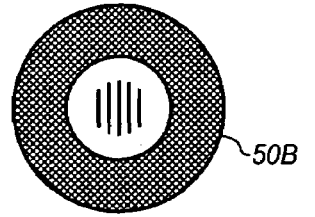
FIG. 4D     FIG. 4E     FIG. 4F

MEASUREMENT OF A SCATTERED LIGHT POINT SPREAD FUNCTION (PSF) FOR MICROELECTRONIC PHOTOLITHOGRAPHY

FIELD

The present description relates to microelectronic and micromechanical photolithography and, in particular, to measuring the scattered light point spread function for a photolithography process.

BACKGROUND

In the production of microelectronic and micromechanical devices, such as semiconductors, memory, processors, and controllers, among others, a mask is used. The mask is placed over a semiconductor wafer to expose or shield different portions of the wafer from light, or some other element. The exposed wafer is then processed with etching, deposition and other processes to produce the features of the various semiconductors in the wafer that make up the finished product.

The masks are typically but not exclusively made up of a quartz plate with a pattern of chrome lines and blocks. Masks can also be made up of reflective mask technology for extreme ultraviolet wavelengths. The quartz allows light to pass and the metal lines reflect light. Different materials are used in different applications and masks may also have portions that change the phase of some of the light in order to control interference or diffraction effects. The masks are designed using computer design programs that derive an aerial view or image of the printed wafer based on the electronic circuitry that is to be built on the wafer. The mask is designed to produce this aerial image on the wafer based on using a particular set of photolithography equipment. In other words, the mask must be designed so that when a particular wavelength of light at a particular distance is directed to a wafer through a particular set of optics and the mask, the desired pattern will be illuminated with the desired intensity on the wafer. The complexity of each mask used to make a chip reflects the complexity of that chip.

In order to enhance the accuracy and the resolution of the pattern that results on the wafer. A variety of different optimization techniques are typically applied to the mask. These techniques include optical proximity correction (OPC), off-axis illumination (OAI), attenuated phase shifted mask (APSM) enhanced lithography, embedded phase shifted mask (EPSM) lithography, extreme ultraviolet (EUV) & X-ray reflective mask technology, and other techniques. These techniques are optimized for an expected range of variations in the parameters of the printing process (focus, intensity, chemistry, wafer composition, etc.). (The combination of these variations of the parameters of the printing process is sometimes referred to as the process window.)

OPC and other techniques may be tailored to particular fabrication processes and process windows by applying measured parameters of the process. The scattered light point spread function (PSF) may be used by OPC, for example, to improve the results of OPC for a particular process window. The PSF of the scattered light of a scanner for optical proximity correction (OPC) indicates the amount of scattered light and the range of travel distances of the scattered light. The PSF impacts the control of critical dimensions (CD) in a microelectronic circuit or device.

The point spread function (PSF) of scattered light on a lithography exposure tool (scanner) is determined by printing patterns on a wafer and then measuring the results. The mask used to print the features has features with a range of dimensions so that the scattering with features of different shapes and at different dimensions can be compared. Based on the resulting printed wafer, the change in a monitoring feature's critical dimensions (CD) as printed on the wafer can be measured.

The CD of a monitoring feature is varied by modifying the layout environment around it. The layout modifications cause variations in the scattered light intensity. PSF is measured in at least two different ways. In one approach, a one dimensional transparency edge is with monitoring features located at different distances from the one dimensional edge on the mask. Another approach uses two dimensional rectangular shaped transparency edges and the monitoring features are placed relative to the rectangular edges. There are a large variety layouts for the two dimensional rectangular methods which include the monitoring feature in the center of the rectangular pattern.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

FIG. 3A is a diagram of a monitor feature surrounded by a small opaque circular pattern as it might appear on a test reticle according to an embodiment of the invention;

FIG. 3B is a diagram of a monitor feature surrounded by a small partially transparent circular pattern as it might appear on a test reticle according to an embodiment of the invention;

FIG. 3C is a diagram of a monitor feature surrounded by a small circular pattern still more transparent than that of FIG. 3B as it might appear on a test reticle according to an embodiment of the invention;

FIG. 3D is a diagram of a monitor feature surrounded by a large opaque circular pattern as it might appear on a test reticle according to an embodiment of the invention;

FIG. 3E is a diagram of a monitor feature surrounded by a large partially transparent circular pattern as it might appear on a test reticle according to an embodiment of the invention;

FIG. 3F is a diagram of a monitor feature surrounded by a circular pattern still more transparent than that of FIG. 3E as it might appear on a test reticle according to an embodiment of the invention;

FIG. 4A is a diagram of a circular pattern composed of coarse rectangular blocks as it might appear on a test reticle according to an embodiment of the invention;

FIG. 4B is a diagram of another circular pattern composed of medium resolution rectangular blocks as it might appear on a test reticle according to an embodiment of the invention;

FIG. 4C is a diagram of a circular pattern composed of very fine rectangular blocks as it might appear on a test reticle according to an embodiment of the invention;

FIG. 4D is a diagram of an annular pattern composed of coarse rectangular blocks as it might appear on a test reticle according to an embodiment of the invention;

FIG. 4E is a diagram of an annular pattern composed of medium resolution rectangular blocks as it might appear on a test reticle according to an embodiment of the invention;

FIG. 4F is a diagram of an annular pattern composed of very fine rectangular blocks as it might appear on a test reticle according to an embodiment of the invention;

DETAILED DESCRIPTION

Figure 1:
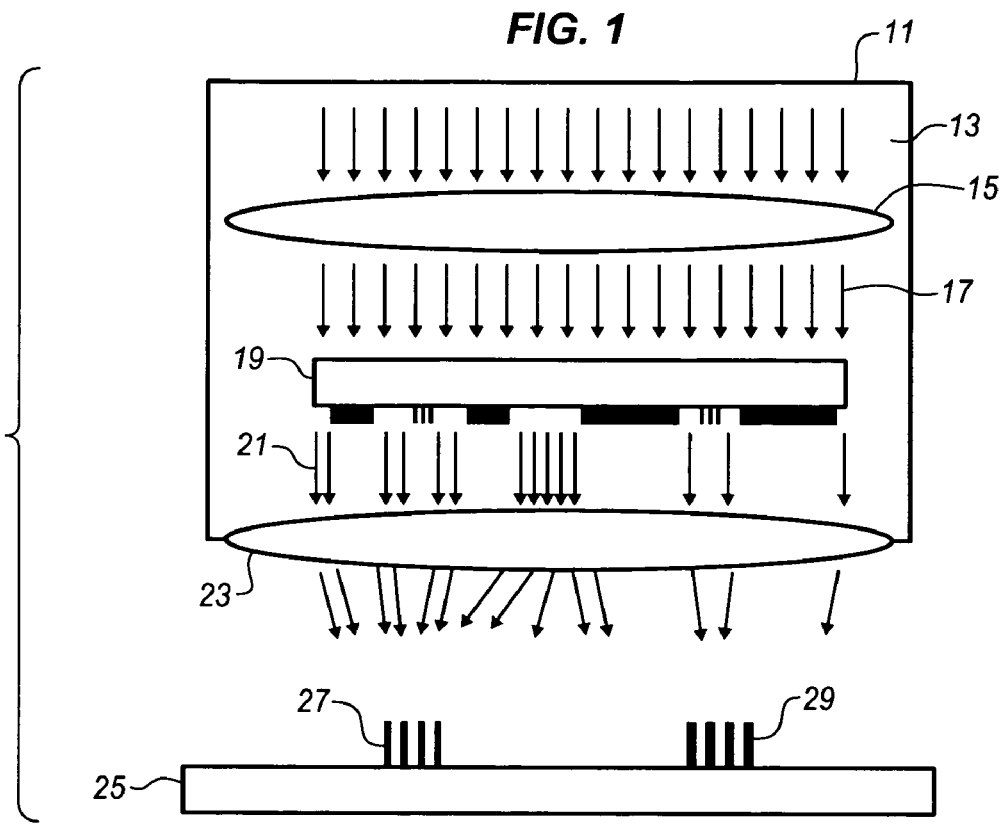
FIG. 1 is a diagram of a patterning light through a test reticle that has different sized circular features according to an embodiment of the invention.

As described below, data measurement to calculate a PSF may be improved so that OPC and other optimization techniques may be better able to correct for scattered light variations caused by pattern density variation in mask layouts. Simpler analysis, fewer and smaller experimental rounding errors, and greater sensitivity in measuring scattered light may all be achieved. This results in a more accurate measurement of PSF for improved control of CD variations.

Circular patterns may be placed in some pattern on a mask or reticle. A reticle may be used to refer to the mask and its carrier in photolithography and the two terms may be used interchangeably in most contexts of the present description. A monitoring pattern is placed on the reticle roughly in the center of each circular pattern. The circular patterns form equidistant transparency edges from the monitoring pattern. This is a significant contrast to current single edge and rectangular edge methods that have their edges at non-equidistant distances from their monitoring patterns.

A series of differently sized circular patterns (SDSCP) with the same monitoring pattern roughly in the center of each circular pattern in the series provides a very accurate measure of CD variations with a variation in scattered light. Scattered light intensity versus the light's travel distance is monitored by measuring the CDs of the monitoring patterns in the SDSCP. The differently sized circular edges in the SDSCP allow scattered light intensity to be monitored as a function of circular size which is directly related to radial travel distance by the scattered light. The PSF can be easily modeled from the photosensitivity of the resist, the change in CD values in the SDSCP, and the SDSCP dimensions.

A major improvement in PSF measurement may be obtained by using the SDSCP. It has a larger scattered light signal for larger travel distances compared to a one dimensional monitor and a simpler analysis of the data. This signal increase occurs because the scattered light is related to the transparent area where the light goes through multiplied by the flux of light. The circular patterns have a transparent area that increases as a function of radius to give higher weighting for the scattered light coming from farther distances. This higher weighting for farther distances improves the sensitivity at these farther distances because the scattered light flux from farther distances typically decreases for one dimensional scattered light monitor methods.

Current one dimensional patterns show a weaker signal at farther distances because they do not utilize the benefits of two dimensions. Current two dimensional rectangular patterns do not have equidistant transparency edges. Their analysis is significantly more complex and is subject to larger experimental rounding errors. A circular patterning method provides an improved signal, a simpler set of data to determine the PSF for scattered light, and less experimental rounding errors.

A set of differently sized circular designs with a patterning monitor structure in the center provides a sensitivity improvement for calculating a PSF. This may be attributed in part to the increase in transparency area that comes with increases in the radii of the circular designs. Differently sized circular patterns also provide a computationally simpler method of determining a PSF with much fewer experimental rounding errors than a rectangular method because the circular patterns have equidistant transparency edges.

FIG. 1 shows an example of an apparatus for performing measurements of PSF on a wafer. Scattered light may be monitored using different sized two-dimensional circular designs on the reticle. The patterning of identical patterns in the center of each of the differently size designs allows the monitoring of scattered light as a function of the radius of the circles. A stepper 11 directs light to a reticle 19. The light 13 passes into the reticle through a top protective collimating lens 15. The collimated light 17 strikes a mask 19 in a scanning pattern and is either blocked (or absorbed as with reflective masks) or transmitted (or reflected as with reflective masks) based on the pattern on the mask 19. The patterned light 21 passes through a second lens element of the reticle to hit the wafer 25. As shown in FIG. 1, the transmitted (or reflected) light is in part scattered as it travels from the mask to the wafer.

The reticle can be any of a variety of different types. Existing reticle types, including chrome/quartz two tone reticles, EPSM, EUV & X-ray reflective mask, or alternating alt-PSM masks, may be used. However, the invention is not so limited. The described approach may also be applied to a wide range of different types of processes and different processing parameters. The wafer may be made of a variety of different materials including silicon, gallium arsenide, lithium niobate, and ceramics. The illumination may also take a variety of different forms and wavelengths depending on the process that is to be measured. One application for the described approach is exposure of photoresist on a silicon substrate, however, PSF may be measured for many other processes.

Figure 2A:
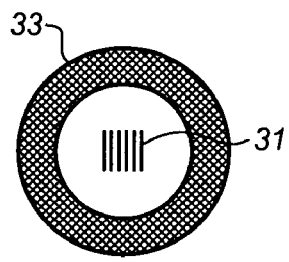
FIG. 2A is a diagram of a monitor feature surrounded by a circular pattern as it might appear on a test reticle according to an embodiment of the invention.

A first group 27 of four patterned lines on the wafer diagrammatically represents the intensity or dose or exposure level on the wafer that may be obtained when the mask has a pattern of four lines 31 surrounded by a small or thin-walled annulus 33 as shown in FIG. 2A. A second group 29 of wider patterned lines on the wafer diagrammatically represent a exposure level that may be obtained with the same four lines 31 surrounded by a much larger or thicker-walled annulus. The thin-walled annulus allows more light to be scattered both from the inside and outside of the annulus which increases the overall exposure dose of the feature and reduces its patterned size. The thicker-walls reduce the amount of scattering which decreases the overall exposure dose of the feature and increases its patterned size. The PSF of the scattered light can quantitatively characterize this pattern difference.

In order to measure the amount of scattering and the distance scattered by the exposure light, a series of circular pattern designs may be used on a reticle with the same monitoring feature in the center of each circular pattern. The series of circular designs allows scattered light to be determined by measuring the patterned CD of the monitoring feature in the center of each different circular pattern. The distance between the circular pattern edges and the center monitoring feature and the difference in patterning between circular patterns provides the quantitative information about the PSF.

The circular designs on the reticle may take a variety of different forms. For example, the circular designs may include (1) opaque disks which are surrounded by transparent areas, (2) transparent disks which are surrounded by opaque areas, (3) transparent annular rings: which have an opaque environment inside and outside of the annular disk, or (4) opaque annular rings which have a transparent environment inside and outside of the annular disk.

The opaque areas in the circular designs may be made to be anything from 100% opaque reticle material to 100% transmissive (for transmissive reticles) by using either dummification with opaque reticle material or materials that are partially transmissive. These different material and techniques may be applied in a variety of different patterns. Dummification refers to using features that are analogous to dummy features to create the circle pattern. Dummy features are printed on the wafer but are not part of a circuit. They may be used to aid the printing of other features, as position markers or for a variety of other reasons.

The partially transparent or partially opaque areas may be used to reduce the difference in exposure dose between the light and dark parts of the test patterns. In the illustrated test patterns, there are some large areas of dark and some large areas of light. This may not accurately reflect the pattern density that will actually be printed when making microelectronic layouts. The high contrast (100%) between light and dark areas may also not work well with some photoresist materials. Using partially transmissive and reflective features may result in a reduction in non-ideal photoresist responses for the extreme transparency environment and more accurate scattered light results.

In other words, dummification or partially transmissive material in the circular design can allow scattered light measurements to be decoupled from the non-linear dissolution behavior of some kinds of photoresist in the border regions between completely opaque to completely transparent mask exposure. When measuring processes that have a good photoresist response in the extreme bright and dark areas, the maximum scattered light signal in a PSF measurement may be obtained when using rings that are 100% transparent and 100% opaque.

For the most useful PSF results, the measurements are performed using the same photoresist and processing as will be used in the manufacturing processes. This gives measurements of how the patterning of certain dimensions of a layout by a particular process is impacted by scattered light. However, some photoresist materials have non-linear dissolution behaviors and these behaviors have non-linear interactions with scattered light when going from 100% transparent to 100% opaque areas. The nonlinear behavior may obscure any accurate measurement of PSF. In addition, while these interactions are important to characterize, standard microelectronic architectures do not vary over this full range of transparency and characterizing CD variation from scattered light over a finite range of transparencies is needed. A restricted range of transparencies of the circular pattern can be obtained by creating a circular pattern out of dummy structures where the dummy structures could be of any shaped feature. The transparency can also be varied by changing reticle materials or changing the reticle material thickness. A combination of dummification and reticle material type or thickness may also be used.

Some examples of circular designs with different levels of opacity are provided in FIGS. 3A to 3F. In each of FIGS. 3A to 3F, the same monitoring feature is shown, however, as mentioned above, other features may be used in addition or instead of the four parallel lines. In FIG. 3A, a small annulus 37 surrounds the monitoring feature 35. The annulus is 100% opaque, such as chrome. In FIG. 3B, an annulus 39 of the same size surround the feature 35. However, this annulus is partially opaque. In these figures white represents a transparent portion of the mask and black represents opaque material, typically chrome. The example of FIG. 3B shows one degree of opacity or dummification, while the example of FIG. 3C shows a lower degree or opacity or dummification using opaque dummy structures in which the same feature 35 is surrounded by an annulus 41 of roughly the same size that is still more transparent.

Figure 2B:
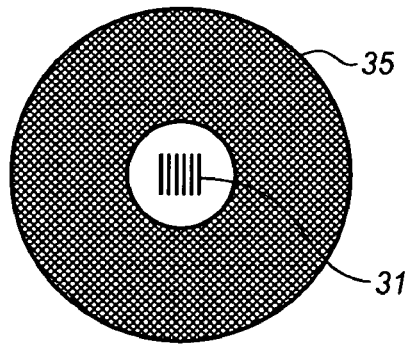
FIG. 2B is a diagram of a monitor feature surrounded by a different circular pattern as it might appear on a test reticle according to an embodiment of the invention.

FIG. 3D shows a larger or thicker-walled opaque annulus 43, similar to that of FIG. 2B surrounding the monitor feature 35. In FIG. 3E, the annulus 45 has become less opaque than in the example of FIG. 3D and in FIG. 3F, the annulus 47 is still less opaque.

In the examples described thus far, the patterns are all circular. However, this is not essential. More importantly each pattern surrounds the central monitor feature and the pattern is evenly distributed about the monitor feature. The even distribution makes for a consistent light scattering effect from all directions. As a result, the PSF measurements are more reliable and easier to analyze. The even distribution may be provided by shapes that are not circles or that are approximations of circles.

Three examples of approximations of a circular shape are provided in FIGS. 4A to 4C. The shape 48A in FIG. 4A uses a symmetric pattern of rectangles to approximate an annulus. The size of the rectangles may be varied in different test patterns to determine an optimal size or the size of the rectangles may be dictated by the mask technology. For example, many masks are made by pixilating patterns into rectangles of transparent (or reflective for reflective masks) or less transparent (or less reflective for reflective masks). The size of the squares limits the resolution of any shape that is printed on the mask. The size of the rectangles may also be selected using another optimization technology.

In FIG. 4B, the annulus 49A uses more rectangles that are roughly half the size of those in FIG. 4A. The finer resolution blocks more closely approximate the smooth shapes of FIG. 2A. In FIG. 4C, the rectangular blocks are small enough that the circle 50A appears to have smooth sides. The arrow between FIGS. 4B and 4C is to indicate that there are many other degrees of resolution between the two circles 49A, 50A.

There is also at least one more degree of resolution between the first two circles 48A, 49A.

FIGS. 4D to 4F represent the same levels of resolution as in FIGS. 4A to 4C but with a annulus shape. The monitor feature is the same as in FIGS. 4A to 4C, nested lines that fill the inner area of the central circle. In FIG. 4D a coarse resolution annulus 48B with the same resolution as the circle of FIG. 4A is shown. However, there is a larger opening in the center which is filled with a smaller ring. The smaller ring surrounds the monitor feature. The smaller ring is shown as having smooth lines, however, it may also be drawn with a coarser resolution and even with the same resolution as the outer ring 48B. FIG. 4E shows an annulus 49B in the same configuration as in FIG. 4D, but with the same resolution as that of FIG. 4B. FIG. 4F shows an annulus in the same configuration, but with the fine resolution of FIG. 4C. The arrow indicates that there is a wide range of different possible resolutions or rectangle sizes that are possible. The six example shown here are for illustration only.

A variety of different monitoring features may be used in the center of the circular design. Instead of the four parallel line structure 35, patterns containing lines, spaces, holes, end-to-end lines, end-to-end spaces, or any separation between two patterns may be used. A series of nested lines or spaces shown in FIGS. 2A and 2B provides patterning at its iso-focal plane to reduce the influence of focus on the PSF. It also has a tight reticle manufacturing CD tolerance to reduce external CD variations, and has a high sensitivity to exposure variation.

While circular designs are shown, other designs may be used that also provide a roughly equal distance in different directions from the feature to the surrounding shape. While circles are shown in the drawings, the circles may be stretched in one dimension into oval or ellipses of varying shapes to accommodate monitor features that are elongated or that are broader in one location than in another.

The circles may also be approximated by an arrangement of rectangular blocks as shown in FIGS. 4A to 4F. These figures may be regarded as showing circles at different levels of resolution or precision. The first circle has a circumference that may be formed from twelve squares. In the second circle, the circumference may be formed by 28 squares. This produces a closer approximation to a circle. The actual number of squares and their arrangement may take a variety of different shapes. On the other hand, both of the figures with squares around their outer edges may also be considered an approximation of an octagon, with a horizontal side at the top and at the bottom, a vertical side at the left and at the right and diagonal sides going across the outer edges of the squares between the horizontal and vertical sides. Similarly, instead of an eight sided octagon, the shapes in FIGS. 4A and 4B may be considered to be approximations of figures with even more sides. The larger the number of sides, the closer the approximated shapes will resemble a circle. Such polygon approximations may also be adapted to suit the shapes of particular monitor features.

In short, while a large number of different shapes are possible, the mathematics to derive a PSF value are simpler if the shapes are circular. A circular shape also produces a more even exposure pattern. The mathematics are simpler because the distance from the monitor features to the inner and outer edges of the surrounding patterns are the same in all directions. The closer these distances are to each other, the simpler the mathematics will be. For similar distances, the distances can be treated as if they are the same. For this reason, the shapes in FIGS. 4A and 4D may be treated as circular and still good results may be obtained. If the distances vary too much, then this will have to be accommodated in the calculations. A square shape presents significant differences in the distances and therefore produces less accurate results or a difficult computational challenge or both.

Figure 5:
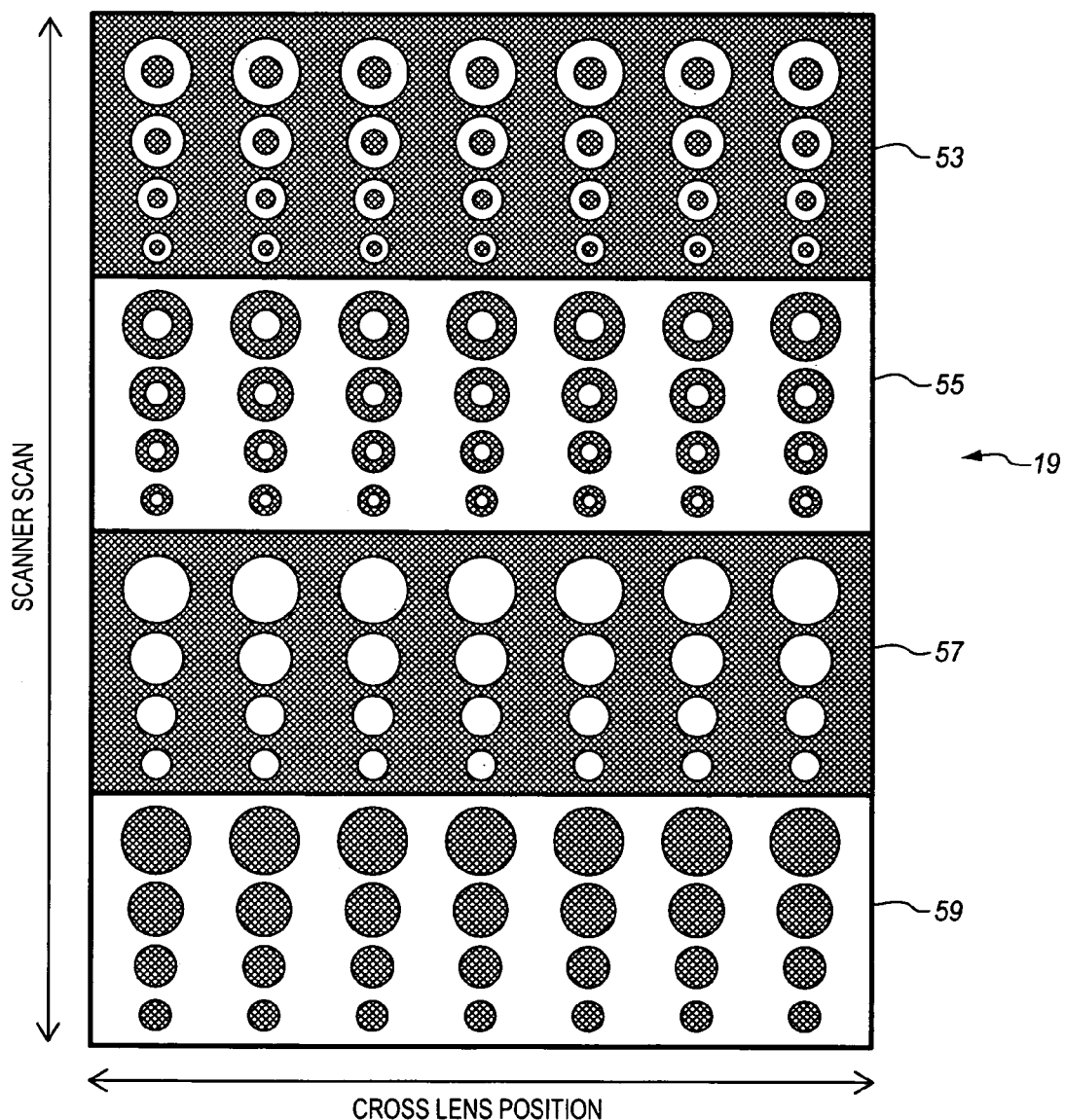
FIG. 5 is a diagram of a portion of test reticle that includes multiple series of different sized circular features according to an embodiment of the invention.

FIG. 5 shows an elevation view diagram of an example of a mask 19 that may be used in the test scenario of FIG. 1. In FIG. 5, there are circular and annular patterns of light and dark areas of different sizes. In the top section 53, there is an opaque environment, shown as black, with a series of transparent annuluses of different sizes. In the second area 55, dark rings are applied to a transparent environment. In the third area 57, transparent circles are applied to an opaque environment and in the fourth area 59, opaque circles are applied to a transparent environment.

The test mask of FIG. 5 has several different series of differently sized patterns. The patterns come with opaque portions and transparent portions and with opaque backgrounds and transparent backgrounds. While it may not be visible in the figure due to the scale of the figure, each pattern surrounds a central monitor feature and the various circles and rings are all evenly distributed about their respective features.

With 193 nm photolithography processes, for example, good measurements may be obtained with a series of annular patterns for which the inner radius ranges from about 1.0 micrometers to 2000 micrometers and the series of outer radii range from about 1.5 micrometers to 5000 micrometers. By testing a wide range of different sizes, the limits of the PSF measurements at both extremes may be determined. Accordingly, with experience, it may be possible to limit the range of sizes for the series of differently sized circular patterns, but only for very similar processes. It may, after running similar measurements be possible to eliminate some of the larger circular patterns from later measurements. As shown in the drawings, the monitor features may fill or almost fill the central area.

The circular patterns can be positioned anywhere on the reticle. In the example of FIG. 5, different sized disks are positioned in the same cross lens position and at different positions along the scan position direction. In FIG. 5, the cross lens position is on the horizontal axis and the cross scan position is on the vertical axis, so the layout appears as columns of circular shapes. The circular shapes change size down the column and then the pattern is repeated in each column. The different positions in the (vertical) scan position allow each position to be characterized independently. This is valuable for systems in which the stepper behaves differently at different positions. The vertical pattern is repeated at different cross lens positions to characterize PSF at different lens positions. The four areas on the reticle layout allow four types of circular designs for the monitor.

The scattered light PSF may be determined in a variety of different ways. In one example, a wafer of the type to be measured, such as a silicon wafer with or without an appropriate anti-reflective coating is coated with photoresist is placed in the stepper or exposure tool. A reticle with a series of circular patterns is patterned using a scanner and a photoresist processing tool, such as a track. The particular design of the circular patterns and the monitoring feature in each center may be selected based on the intended measurements. A variety of different reticles and patterns may be tried until the best or most useful measurements are obtained. The CDs of the patterned features in the center of the circular patterns are then measured using, for example, a manufacturing scanning electron microscope or scatterometry.

The CD measurements may then be analyzed along with the circular patterns' dimensions to determine the scattered light intensity and travel distance for each circular pattern. The CD data may then be applied to any of a variety of different curve fitting approaches to determine a function for the PSF based on the scattered light. Typically, the PSF will be an exponential or Gaussian function. The function may be applied to an optimization algorithm as appropriate for the particular algorithm.

Measurements may be repeated or modified to take different times and process conditions into account. The monitoring patterns and circular patterns may be on the same or different reticles. The monitoring patterns and circular patterns may be centered at different positions on the reticle and the same reticle may be reprinted at different times, under different conditions, and with the reticle shifted to different positions relative to the first exposure.

Figure 6:
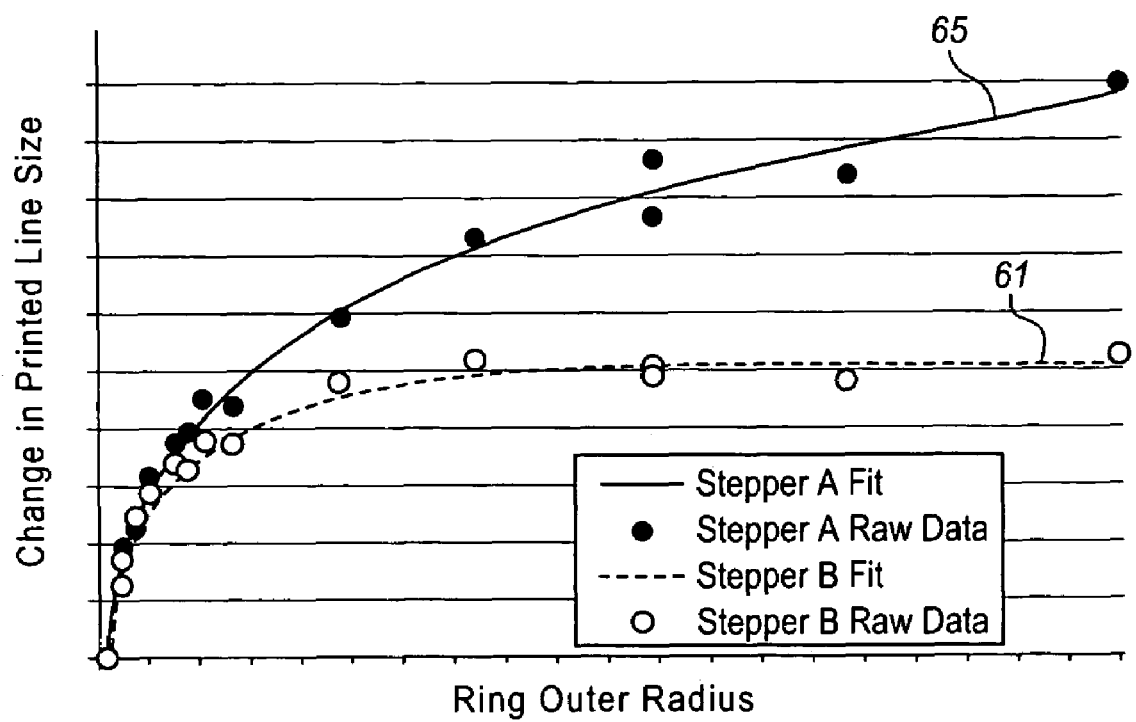
FIG. 6 is a graph of printed line width versus circular feature size as may be obtained from test data using a test reticle according to an embodiment of the invention.

FIG. 6 shows sample data from measurements of the type described above. In FIG. 6, the printed line CD is plotted on the vertical axis and the size of the corresponding outer radius of circle of the SDSCP. Each indicated data point indicates the line CD for a particular feature and annulus combination plotted against the outside diameter of the annulus. For this data, the monitored feature was in the form of a series of parallel nested line as shown e.g. in FIG. 2A and for each circle in the series, the monitoring feature was surrounded by an annulus. The inner diameter was the same for each annulus, but the outer diameter increased for each annulus in the series. The increased outer diameter reduces the amount of scattered light that affects how the feature is printed.

The two curves 61 and 65 demonstrate that the PSF from two different exposure tools can be significantly dissimilar. The curve reaches toward a transition point 63 after which increases in outside diameter make a change in CD but it is much smaller. These curves provide an example of how different processes produce different results with the same masks. The two curves provide an example of how different processes may produce very different results even with the same mask. With the different types of circles and features shown in the drawings a variety of different data sets may be obtained. The curves in FIG. 6 are provided only as an example, and the specific shape of such a curve may depend on a variety of different factors including the layout of the mask.

The CD data in FIG. 6 may then be modeled using a series of exponential or Gaussian functions to come up with a PSF functional form base on the scattered light. The particular form and format of the PSF may be adapted to suit the particular correction algorithm to which the function is to be applied.

As described above, PSF may be measured using series of differently sized circular patterns (SDSCP) and the same monitoring feature in the center of each circular pattern. The difference in the scattered light intensity between these differently sized circular patterns allows the amount of scattered light to be monitored as a function of distance traveled by the scattered light which by definition is the PSF.

The use of a SDSCP improves the sensitivity and simplicity of analysis over current scattered light monitors. The exposure area for the monitoring pattern changes by $2\pi r$ as the radius (r) of the circle is increased. Since the exposure energy from the scattered light is the flux of energy times the exposure area, the signal (amount of exposure light) is amplified by the increase in the exposure area for larger sized circular patterns compared to a fixed exposure area. This improvement in sensitivity at longer distances helps to counteract the decrease in scattered light intensity with decrease in radius.

By contrast, one-dimensional transparency edge monitors have equal exposure area as a function of distance away from the transparency edge. The use of circular patterns compared to rectangular patterns provides a simpler analysis of scattered light intensity versus travel distance measurements and fewer experimental rounding errors. The analysis for a circular pattern is simpler in part because the circular pattern's transparency edge is at a fixed distance from the patterned feature while in a rectangular pattern the corners are further away than the sides. The corners are therefore non-equidistant with the sides.

Embodiments of the present invention may be applied to both circular and annular patterns. The monitoring features may be nested lines or any of a variety of other designs and the variation in their patterned size provides information on the flare intensity versus scattered light travel distance. The PSF may be determined from measuring resulting printed shapes.

Figure 7A:
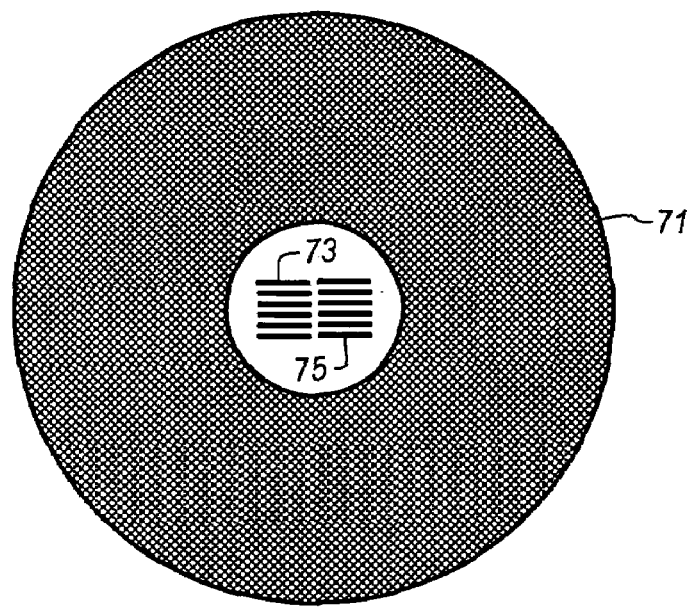
FIG. 7A is a diagram of a monitor feature with end-to-end features surrounded by an opaque circular pattern as it might appear on a test reticle according to an embodiment of the invention.

FIGS. 7A to 7E show further alternative features and circular patterns that may be used to determine a PSF. In FIG. 7A an annular shape 71 similar to that of FIG. 2B surrounds a monitor feature. The monitor feature, as in FIG. 2B has a series parallel line segments. However, in FIG. 7A, the lines are divided into two groups 73, 75 that are aligned end-to-end with a central gap between them.

Figure 7B:
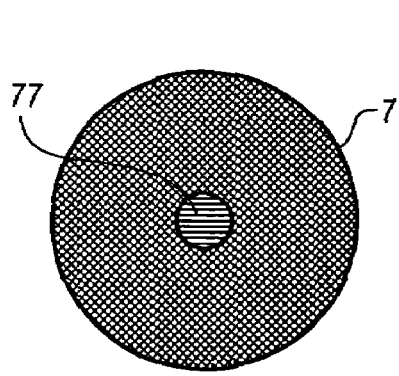
FIG. 7B is a diagram of a monitor feature with line space features where the boundary of the line space features is circular in shape. This feature is surrounded by an opaque circular pattern as it might appear on a test reticle according to an embodiment of the invention.
Figure 7C:
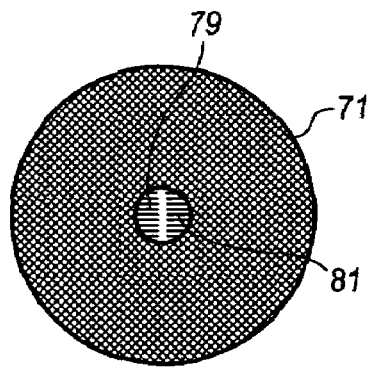
FIG. 7C is a diagram of another monitor feature with end-to-end features where the boundary of the end-to-end features is circular in shape. This feature is surrounded by an opaque circular pattern as it might appear on a test reticle according to an embodiment of the invention.

In FIG. 7B, the annulus 71 surrounds a feature 77 that is composed of parallel lines which have line ends that terminate in a radial manner resulting in line ends with no gaps and with no space from the inner edge of the annulus. The parallel lines fill the entire interior of the annulus compared to all previous figures that show line ends ending in a non-radial manner resulting a square monitor pattern area. This difference in monitoring pattern is beneficial by making mathematical analysis simpler because the monitor structure's edge is radial in shape. In FIG. 7C, the same annulus surrounds a similar feature to that of FIG. 7B, however, this feature, as in FIG. 7A has a central gap. There are two end-to-end monitor features 79, 81 the ends of which are aligned and separated by the central gap.

Figure 7D:
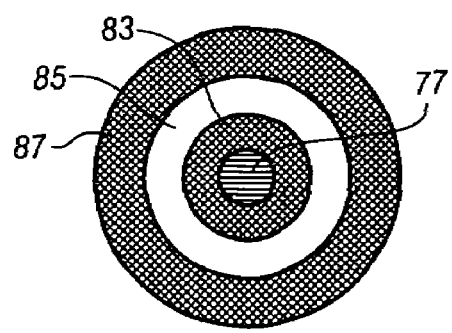
FIG. 7D is a diagram of a monitor feature surrounded by a concentric opaque circular patterns as it might appear on a test reticle according to an embodiment of the invention.
Figure 7E:
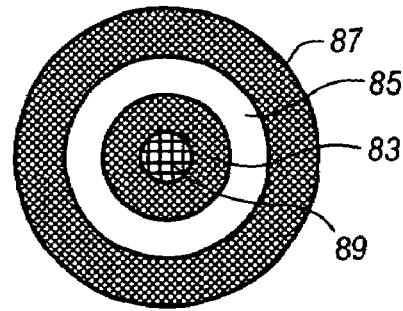
FIG. 7E is a diagram of another monitor feature surrounded by a concentric opaque circular patterns as it might appear on a test reticle according to an embodiment of the invention.

In FIG. 7D, a central feature 77 similar to that of FIG. 7B is surrounded by a multiple annular rings which can help isolate scattered light from a particular radial region. This structure has an inner annulus 83 and an outer annulus 87 with a clear annular space 85 in between. Any of the monitor features shown in any of the figures may be used in the interior of such a circular structure and the structure may designed in a range of different sizes to create the SDSCP mentioned above. FIG. 7E shows an example of the same pair of concentric annular dark rings 83, 87 as in FIG. 7D but with a different structure. The central structure 89 of FIG. 7E is formed from a grid of transparent dots superimposed over a dark or opaque background. As with any of the example in the drawings, the light and dark portions in the rings, circles and features may be reversed as a group or independently.

Figure 8:
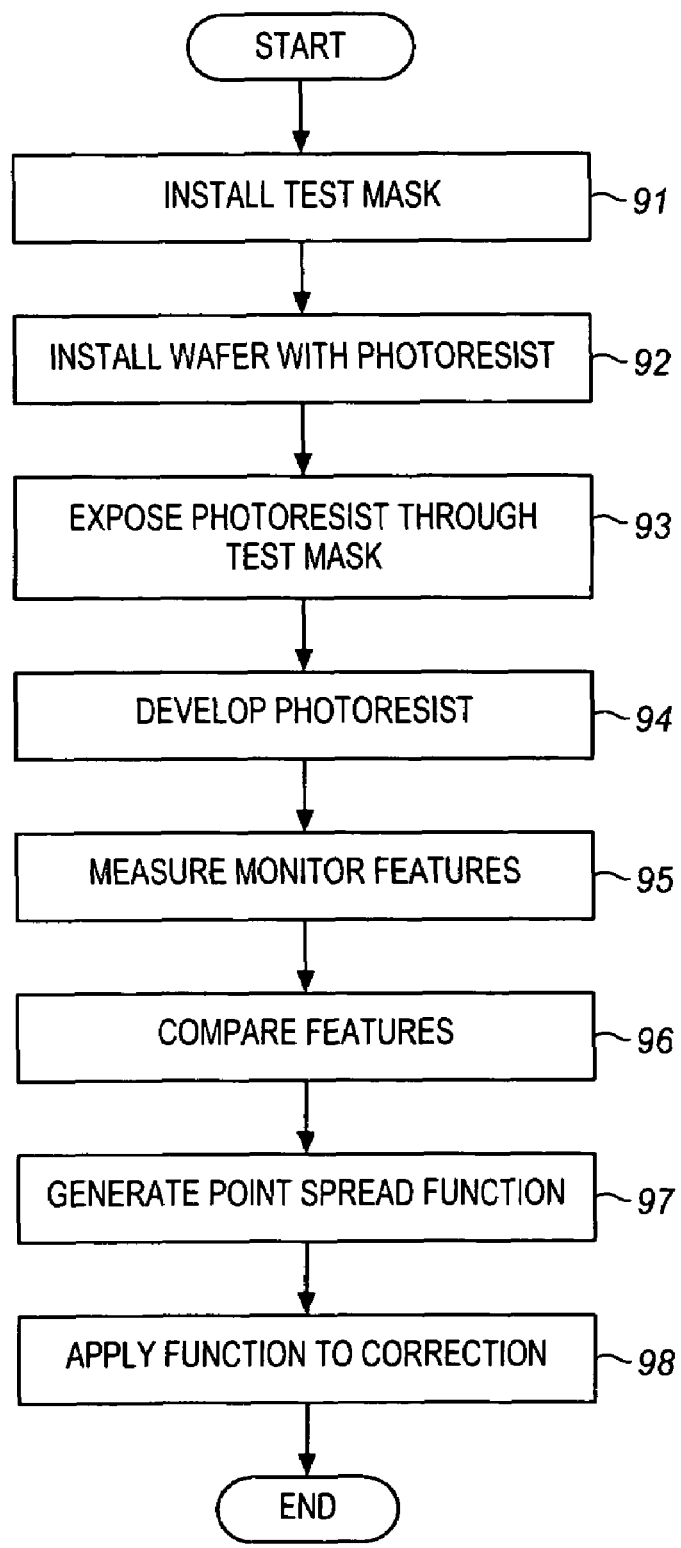
FIG. 8 shows an example of a process of measuring a point spread function in photolithography and applying it to optimizing a mask design according to an embodiment of the present invention.

FIG. 8 shows an example of a process of developing and using a scattered light PSF. At block 91, a test mask is installed into a photolithography tool. The test mask may have one or more series of differently sized circular patterns; each circular pattern surrounding a central monitor feature. The test mask circular patterns may include any one or more of the various patterns shown in the Figures and may resemble the mask of FIG. 5 or some variation thereon. The best mask for any particular measurements will depend upon the process parameters, including the tools, and the features that are intended to be produced.

At block 92, a microelectronic substrate, such as a silicon wafer is installed into the tool. The wafer will normally have a layer of the photosensitive material that is to be tested, for example a layer of photoresist. At block 93, the photosensitive layer on the microelectronic substrate is exposed through the test mask. At block 94, the photoresist is developed. As mentioned above, better values for OPC may be obtained when the tool, the wafer, the photoresist, the exposure and the development process are as close to the intended or actual production process as possible.

At block 95, some indication of the exposure of the photosensitive layer is measured for some number of the monitor features. The CD of the monitor feature, the sharpness or detail of a line of the monitor feature, or any other characteristic may be measured. As an alternative, the exposure dose at particular points or areas may be measured without developing the resist.

At block 96, the measurements are compared to the size of the corresponding circular patterns. In the example of FIG. 7, line thickness is compared to the outer diameter of each circular annulus. This comparison provides a set of pairings. Each comparison represents a data point in two dimensions that compares the two values. Instead, or in addition, other or additional measurements may be compared on the printed features.

At block 97, a function is generated to reflect the comparison. In the described example, the data points are plotted out to form a curve and a curve fitting process is applied to the curve. The curve fitting process produces an exponential, Gaussian or other type of function that reflects the curve. While producing the curve is useful to show the results of the comparison. This is not necessary to generating the function. Typically the function will reflect the mathematical relationship between pairings and such function may be generated mathematically without explicitly producing a curve or an illustration of the collected measurements of any kind.

The function may be improved by using different monitor functions and different types of circular patterns and then combining the results. The results may be averaged, weighted and averaged, histogrammed or combined in any of a variety of different ways. Alternatively, several different functions may be generated and compared to determine which one provides the best results when used in OPC.

At block 98, the generated function is applied to some photolithography mask layout correction regime. OPC algorithm may offer a utility to add a point spread function to the algorithm. The PSF may then be directly applied to an OPC algorithm and the OPC used to correct a mask layout. The PSF may also be used for a variety of other mask optimization, correction and adjustment tools.

Figure 9:
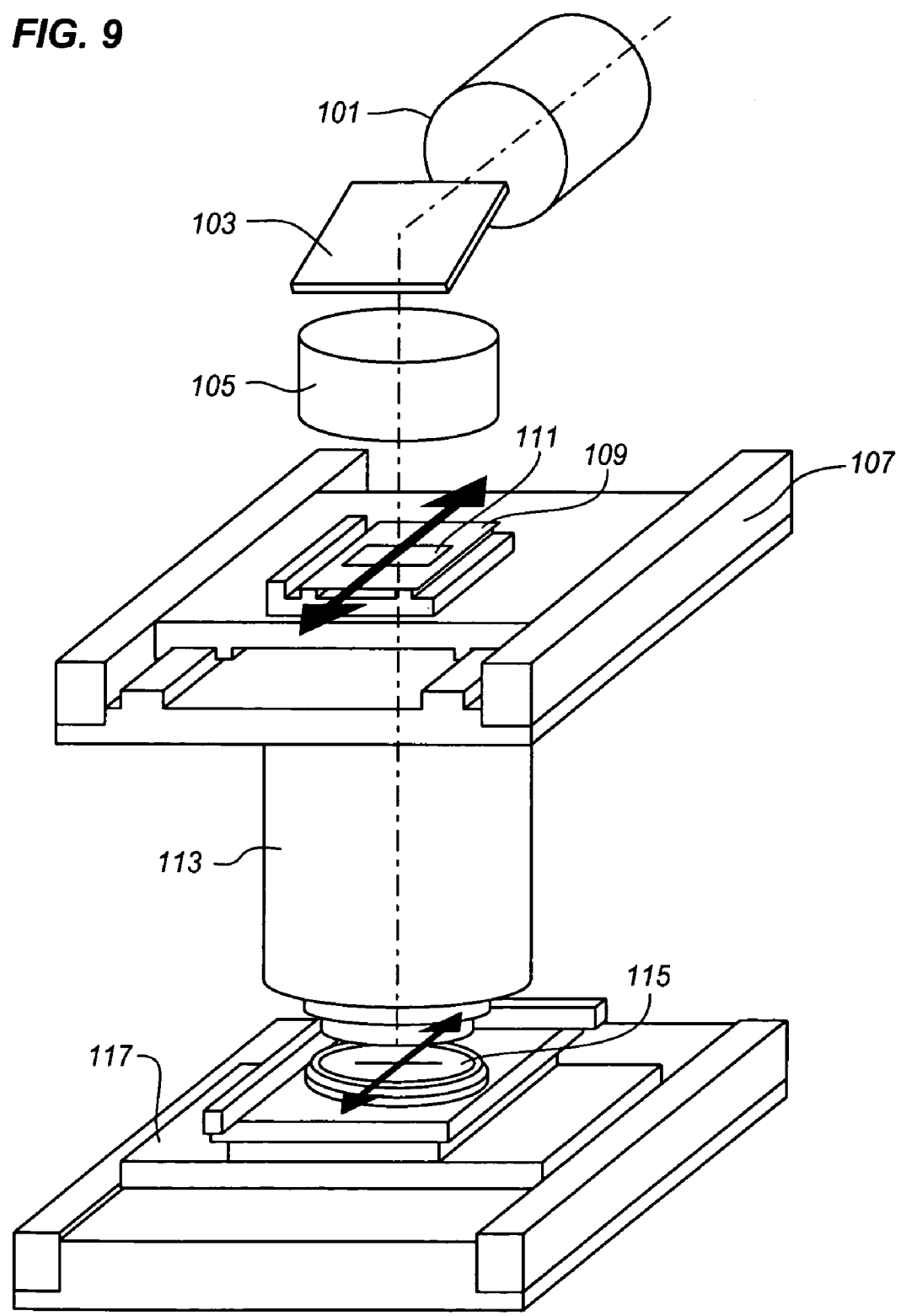
FIG. 9 is a diagram of a semiconductor fabrication device suitable for application to the present invention.

FIG. 9 shows an example of a conventional semiconductor fabrication machine, in this case, a lens-scanning ArF Excimer Laser Stepper, to which the described PSF measurement approach may be applied. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four-fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 9 is an example of a fabrication device that may benefit from embodiments of the present invention. Embodiments of the invention may also be applied to many other photolithography systems.

The mask controls the size of each feature on the wafer. The mask design is made up of chrome metal lines, molybdenum silicide lines, or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

As described above, more accurate PSF measurements may be made using a series of differently sized circular patterns. In all of the illustrated examples, each pattern surrounds a central monitor feature. Each of the differently sized patterns are each evenly distributed about its respective central monitor feature. This is most easily seen using a circle as the pattern. However, very good results may also be obtained with patterns that are not perfect circles. Elliptical patterns or any other rectangular representations of circular patterns, including those shown in FIGS. 4A to 4E, may be used. These patterns have two-dimensional annular shapes with different inner diameters and outer diameters.

There are a great number of variations on the annular shapes. Many are shown in the figures described above. The annular shapes may be an opaque annulus surrounded by a transparent area, a transparent annulus surrounded by an opaque area, an opaque annulus surrounded by a partially transparent or dummified area, a partially transparent or dummified annulus surrounded by an opaque area, a transparent annulus surrounded by a partially transparent or dummified area, or a partially transparent or dummified annulus surrounded by a transparent area. Other variations are also possible.

Similarly, the measurement process may be applied to a wide range of different central monitor features. A few examples of different central monitor features include a set of parallel line segments, isolated lines, parallel space segments, isolated spaces, line end to line end segments, space end to space end segments, an array of elliptical or circular holes, isolated elliptical or circular holes, an array of elliptical or circular lines, or isolated elliptical or circular holes. The particular monitor features to use will depend on the type of microelectronic device to be fabricated, the type of photoresist and many other process parameters.

It is to be appreciated that a lesser or more complex test patter, mask layout, series of circular features, monitor feature, measurement process and photolithography process or system may be used than those shown and described herein. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

In the description above, numerous specific details are set forth. However, embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
    exposing a photosensitive layer of a microelectronic substrate through a test mask, the test mask having a series of differently sized annular patterns, each annular pattern surrounding a central monitor feature, the differently sized patterns each being evenly distributed about its respective central monitor feature wherein the monitor feature is repeated in a two-dimensional pattern of rows and columns across the test mask, and wherein the series of differently sized patterns is repeated in adjacent columns across the mask, each column corresponding to a different cross lens position of an exposure tool;
    measuring an indication of a scattered light point spread function of the exposure of the photosensitive layer using the plurality of differently sized patterns of the series of differently sized patterns;
    comparing the exposure indication to the pattern size;
    fitting the comparison to a scattered light point spread function; and
    applying the function in correcting photolithography mask layouts.

2. The method of claim 1, wherein the series of differently sized patterns comprise two-dimensional annular shapes with uniform inner diameters and a series of different outer diameters.

3. The method of claim 1, wherein the annular shapes are opaque.

4. The method of claim 1, wherein the patterns are elliptical.

5. The method of claim 4, wherein the elliptical patterns are circular.

6. The method of claim 5, wherein the circular patterns are annular.

7. The method of claim 5, wherein the circular patterns are formed by a grouping of rectangles.

8. A method comprising:
    measuring scattered light propagation through a sample photolithography mask layout, the mask layout having a series of differently sized circular patterns, the differently sized circular patterns each surrounding its respective central monitor feature wherein the monitor feature is repeated in a two-dimensional pattern of rows and columns across the mask, and wherein the series of differently sized patterns is repeated in adjacent columns across the mask, each column corresponding to a different cross lens position of an exposure tool;
    determining a critical dimension for each of the central monitor features;
    comparing the critical dimensions to the corresponding pattern size;
    determining an optical point spread function for scattered light based on the comparison.

9. The method of claim 8, wherein measuring comprises exposing a layer of photoresist through the mask layout and developing the exposed photoresist and wherein determining a critical dimension comprises measuring the thickness of features in the developed photoresist produced from the exposure.

10. The method of claim 9, wherein comparing comprise pairing the measured thicknesses to the corresponding pattern size for the respective measured thickness and wherein determining a function comprises fitting a curve to the pairs.

11. A test pattern on a photolithography mask comprising:
    a monitor feature repeated at multiple locations on the mask; and
    a series of differently sized annular patterns, one annular pattern surrounding each monitor feature, the differently sized patterns each being evenly distributed about its respective central monitor feature wherein the monitor feature is repeated in a two-dimensional pattern of rows and columns across the mask, and wherein the series of differently sized patterns is repeated in adjacent columns across the mask, each column corresponding to a different cross lens position of an exposure tool,
    the annular patterns being configured for use in measuring an indication of a scattered light point spread function based on the series of differently sized patterns to apply to optical proximity correction upon exposure of a substrate through the mask.

12. The mask of claim 11, wherein the monitor feature is repeated at regular intervals across the mask in two dimensions.

13. The mask of claim 11, wherein the monitor feature is repeated at positions corresponding to multiple cross lens positions.

14. The mask of claim 11, further comprising the monitor feature repeated at multiple additional locations on the mask; and
    a different series of differently sized patterns, one pattern surrounding each additional monitor feature location.

15. The mask of claim 11, wherein the patterns comprise an opaque annulus.

16. The mask of claim 11, wherein the patterns comprise a transparent annulus on an opaque background.

17. The mask of claim 11, wherein the monitor feature comprises a plurality of parallel line segments.

18. The mask of claim 11, wherein the patterns comprise annular rings with a first amount of transmissivity and an environment surrounding the annular ring having a second level of transmissivity, the difference in transmissivity being caused by using different dummification of the annular ring from in the surrounding environment.

19. The mask of claim 11, wherein the patterns comprise an annular ring with a first level of transmissivity and an environment surrounding the annular ring having a second level of transmissivity, the difference in transmissivity being caused by using different mask materials and material thicknesses in the annular rings from in the surrounding environment.

* * * * *